(12) United States Patent
Tsai et al.

(10) Patent No.: US 11,764,311 B2
(45) Date of Patent: Sep. 19, 2023

(54) OPTICAL DEVICE AND ELECTRONIC DEVICE

(71) Applicant: Advanced Semiconductor Engineering, Inc., Kaohsiung (TW)

(72) Inventors: Yu-Pin Tsai, Kaohsiung (TW); Tsung-Yueh Tsai, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 53 days.

(21) Appl. No.: 17/488,076

(22) Filed: Sep. 28, 2021

(65) Prior Publication Data

US 2022/0020885 A1  Jan. 20, 2022

Related U.S. Application Data

(63) Continuation of application No. 16/503,318, filed on Jul. 3, 2019, now Pat. No. 11,133,423.

(51) Int. Cl.
*H01L 31/02* (2006.01)
*H01L 25/16* (2023.01)
*H01L 31/0203* (2014.01)

(52) U.S. Cl.
CPC ...... *H01L 31/02002* (2013.01); *H01L 25/162* (2013.01); *H01L 25/165* (2013.01); *H01L 25/167* (2013.01); *H01L 31/0203* (2013.01)

(58) Field of Classification Search
CPC .......... H01L 31/02002; H01L 31/0203; H01L 31/173; H01L 25/162; H01L 25/165; H01L 25/167; H01L 27/14636
See application file for complete search history.

(56) References Cited

U.S. PATENT DOCUMENTS

| 8,912,049 B2 * | 12/2014 | Wei | H01L 25/167 438/33 |
| 9,406,658 B2 * | 8/2016 | Lee | H01L 23/5389 |

(Continued)

OTHER PUBLICATIONS

Non-Final Office Action for U.S. Appl. No. 16/503,318, dated Oct. 16, 2020, 21 pages.

(Continued)

*Primary Examiner* — Dao H Nguyen
(74) *Attorney, Agent, or Firm* — FOLEY & LARDNER LLP

(57) ABSTRACT

An optical device includes a first circuit layer, a light detector, a first conductive pillar and an encapsulant. The first circuit layer has an interconnection layer and a dielectric layer. The light detector is disposed on the first circuit layer. The light detector has a light detecting area facing away from the first circuit layer and a backside surface facing the first circuit layer. The first conductive pillar is disposed on the first circuit layer and spaced apart from the light detector. The first conductive pillar is electrically connected to the interconnection layer of the first circuit layer. The encapsulant is disposed on the first circuit layer and covers the light detector and the first conductive pillar. The light detector is electrically connected to the interconnection layer of the first circuit layer through the first conductive pillar. The backside surface of the light detector is exposed from the encapsulant.

16 Claims, 21 Drawing Sheets

(56) References Cited

U.S. PATENT DOCUMENTS

| | | | |
|---|---|---|---|
| 9,905,722 B1 | 2/2018 | Chen et al. | |
| 10,177,268 B2* | 1/2019 | Chen | H01L 31/16 |
| 10,711,268 B2 | 7/2020 | Murakami et al. | |
| 2010/0006864 A1* | 1/2010 | Steigerwald | H01L 33/22 |
| | | | 257/E33.056 |
| 2012/0217049 A1 | 8/2012 | Hanai et al. | |
| 2015/0287708 A1* | 10/2015 | Lin | H01L 23/5389 |
| | | | 438/109 |
| 2017/0084589 A1 | 3/2017 | Kuo et al. | |

OTHER PUBLICATIONS

Notice of Allowance for U.S. Appl. No. 16/503,318, dated May 26, 2021, 15 pages.

* cited by examiner

OPTICAL DEVICE AND ELECTRONIC DEVICE

CROSS-REFERENCE TO RELATED APPLICATIONS

The present application is a continuation of U.S. application Ser. No. 16/503,318 filed Jul. 3, 2019, now U.S. Pat. No. 11,133,423, the contents of which are incorporated herein by reference in their entirety.

BACKGROUND

1. Technical Field

The present disclosure relates to an optical device, and more particularly, to an optical device including a fan-out structure.

2. Description of the Related Art

Optical devices are used in many applications (e.g., image sensor, proximity sensor or the like). An optical device may include various electronic components, such as a light emitter, a light detector, a controller and/or processor. Those electronic components are disposed on a substrate and electrically connected to the substrate by wire bonding technique. However, the substrate has a relatively large area and thickness. In addition, an additional space and height are included for wire bonding loops, and this would hinder the miniaturization of the optical device.

SUMMARY

In some embodiments, an optical device includes a first circuit layer, a light detector, a first conductive pillar and an encapsulant. The first circuit layer has an interconnection layer and a dielectric layer. The light detector is disposed on the first circuit layer. The light detector has a light detecting area facing away from the first circuit layer and a backside surface facing the first circuit layer. The first conductive pillar is disposed on the first circuit layer and spaced apart from the light detector. The first conductive pillar is electrically connected to the interconnection layer of the first circuit layer. The encapsulant is disposed on the first circuit layer and covers the light detector and the first conductive pillar. The light detector is electrically connected to the interconnection layer of the first circuit layer through the first conductive pillar. The backside surface of the light detector is exposed from the encapsulant.

In some embodiments, an optical device includes a circuit layer, a light detector, a controller and an encapsulant. The circuit layer has an interconnection layer and a first dielectric layer. The light detector is disposed on the circuit layer and electrically connected to the interconnect layer of the circuit layer. The light detector has an active surface facing the circuit layer and a backside surface opposite to the active surface. The light detector has a light detecting area adjacent to the active surface. The controller has an active surface facing away from the circuit layer and a backside surface disposed on the backside surface of the light detector. The encapsulant is disposed on the circuit layer and covers the light detector and the controller.

In some embodiments, a method for manufacturing an optical device includes (a) forming a first circuit layer; (b) attaching a backside surface of a light detector to the first circuit layer, the light detector having a light detecting area facing away from circuit layer; (c) disposing a first protection film on the light detecting area of the light detector; (d) forming an encapsulant on the first circuit layer to cover the light detector; and (e) removing the first protection film to expose the light detecting area of the light detector.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

Figure 1:
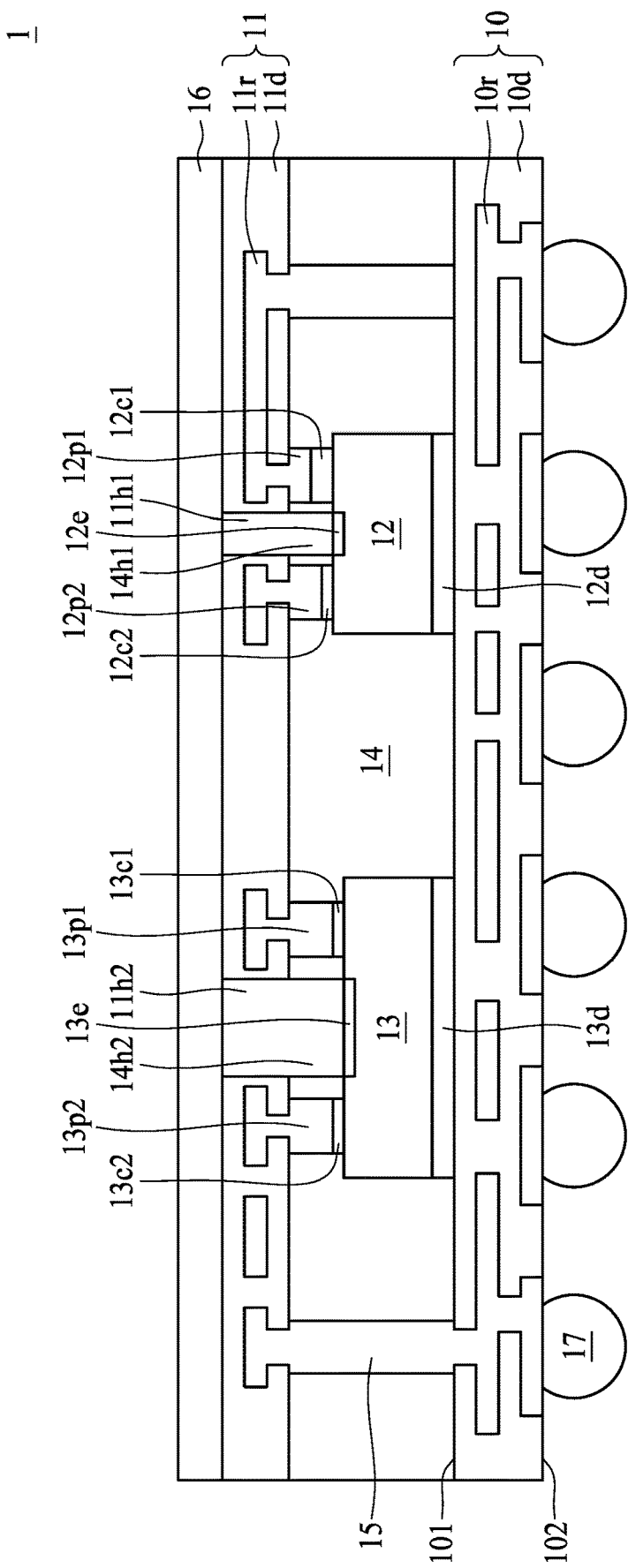
FIG. 1 illustrates a cross-sectional view of an optical device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1 illustrates a cross-sectional view of an optical device 1 in accordance with some embodiments of the present disclosure. The optical device 1 includes circuit layers 10, 11, electronic components 12, 13, an encapsulant 14, conductive pillars (or posts) 15, a film 16 and electrical contacts 17.

The circuit layer 10 includes an interconnection layer (e.g., redistribution layer, RDL) 10r and a dielectric layer 10d. A portion of the interconnection layer 10r is covered or encapsulated by the dielectric layer 10d while another portion of the interconnection layer 10r is exposed from the dielectric layer 10d to provide electrical connections. In some embodiments, the dielectric layer 10d may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layer 10d may include an inorganic material, such as silicon, a ceramic or the like. In some embodiments, there may be any number of interconnection layers 10r depending on design specifications. The circuit layer 10 has a surface 10l and a surface 102 opposite to the surface 10l.

The electronic component 12 is disposed on the surface 10l of the circuit layer 10. In some embodiments, a backside surface of the electronic component 12 is attached to the surface 10l of the circuit layer 10 through an adhesion layer (e.g., die attach film, DAF) 12d. The electronic component 12 has a light emitting area 12e facing away from the circuit layer 10 and configured to emit a light beam toward an object. The light emitting area 12e is located adjacent to an active surface of the electronic component 12. In some embodiments, the electronic component 12 may be a light emitter or a light emitting device, such as a light-emitting diode (LED) or other light emitting die. For example, the electronic component 12 may include, e.g., an LED, a laser diode, another device that may include one or more semiconductor layers, or a combination of two or more thereof. The semiconductor layers may include silicon, silicon carbide, gallium nitride, or any other semiconductor materials.

The electronic component 12 has conductive pads 12c1 and 12c2 (e.g., P-terminal and N-terminal) disposed on the active surface of the electronic component 12 to provide electrical connections. In some embodiments, the conductive pads 12c1, 12c2 and the light emitting area 12e are disposed at or adjacent to the active surface of the electronic component 12. The conductive pads 12c1 and 12c2 may disposed adjacent to edges of the active surface of the electronic component 12 while the light emitting area 12e may be disposed at or adjacent to the center of the active surface of the electronic component 12. Conductive pillars (e.g., copper pillars) 12p1 and 12p2 are respectively electrically connected to the conductive pads 12c1 and 12c2 of electronic component 12. For example, the conductive pillars 12p1 and 12p2 electrically connect the conductive pads 12c1 and 12c2 with the circuit layer 11. In some embodiments, a thickness of the conductive pad 12c1 is different from that of the conductive pad 12c2, and a height of the conductive pillar 12p1 is different from that of the conductive pillar 12p2. For example, as shown in FIG. 1, the thickness of the conductive pad 12c1 is greater than that of the conductive pad 12c2, and the height of the conductive pillar 12p1 is less than that of the conductive pillar 12p2. By providing the conductive pillars 12p1 and 12p2 to connect the conductive pads 12c1 and 12c2 with the circuit layer 11 can ensure that the connection surfaces (connection points) are located at the same plane or level.

The electronic component 13 is disposed on the surface 10l of the circuit layer 10 and spaced apart from the electronic component 12. In some embodiments, a backside surface of the electronic component 13 is attached to the surface 10l of the circuit layer 10 through a DAF 13d. The electronic component 13 has a light detecting area 13e facing away from the circuit layer 10 and configured to receive or detect a light beam reflected from the object. The light detecting area 13e is located adjacent to an active surface of the electronic component 13. In some embodiments, the electronic component 13 may be a light detector which may be, e.g., a PIN diode, a photodiode, or a phototransistor. In some embodiments, the optical device 1 may act as a proximity sensor or any other sensors including a light emitting component and a light detecting component.

The electronic component 13 has conductive pads 13c1 and 13c2 disposed on the active surface of the electronic component 13 to provide electrical connections. In some embodiments, the conductive pads 13c1, 13c2 and the light detecting area 13e are disposed at or adjacent to the active surface of the electronic component 13. The conductive pads 13c1 and 13c2 may disposed adjacent to edges of the active surface of the electronic component 13 while the light emitting area 13e may be disposed at or adjacent to the center of the active surface of the electronic component 13. Conductive pillars (e.g., copper pillars) 13p1 and 13p2 are respectively electrically connected to the conductive pads 13c1 and 13c2 of electronic component 13. For example, the conductive pillars 13p1 and 13p2 electrically connect the conductive pads 13c1 and 13c2 with the circuit layer 11.

The encapsulant 14 is disposed on the surface 10l of the circuit layer 10 and covers the electronic components 12, 13 and the conductive pillars 15. The encapsulant 14 has openings 14h1 and 14h2 to expose the light emitting area 12e of the electronic component 12 and the light detecting area 13e of the electronic component 13. For example, the encapsulant 14 covers the active surfaces (including the conductive pads 12c1, 12c2, 13c1 and 13c2) of the electronic components 12 and 13 except for the light emitting area 12e and the light detecting area 13e. In some embodiments, the opening 14h1 is over the light emitting area 12e of the electronic component 12 and has a width equal to or greater than a width of the light emitting area 12e. In some embodiments, the opening 14h2 is over the light detecting area 13e of the electronic component 13 and has a width equal to or greater than a width of the light detecting area 13e. The encapsulant 14 is formed of or includes an opaque material or a light absorbing material to avoid the light emitted from the electronic component 12 from directly entering the light detecting area 13e of the electronic component 13. This can mitigate or eliminate the cross-talk issue between the electronic components 12 and 13. In some embodiments, the encapsulant 14 may include optical density (OD) 4 materials, such as black molding compound.

The circuit layer 11 is disposed on the encapsulant 14. The circuit layer 11 includes an interconnection layer (e.g., RDL) 11r and a dielectric layer 11d. A portion of the interconnection layer 11r is covered or encapsulated by the dielectric layer 11d while another portion of the interconnection layer 11r is exposed from the dielectric layer 11d to provide electrical connections. For example, the interconnection layer 11r exposed from the dielectric layer 11d is electrically connected to the electronic components 12 and 13 through the conductive pillars 12p1, 12p2, 13p1 and 13p2. For example, the interconnection layer 11r exposed from the dielectric layer 11d is electrically connected to the circuit layer 10 (e.g., to the interconnection layer 10r of the circuit layer 10) through the conductive pillar 15. In some embodiments, the circuit layer 11 is similar to the circuit layer 10, and the descriptions of the circuit layer 10 can be applicable to the circuit layer 11. In some embodiments, the film 16 (e.g., infrared radiation (IR) pass filter film) is disposed on the circuit layer 11. In other embodiments, the film 16 can be omitted depending on different specifications.

The circuit layer 11 has an opening 11h1 corresponding to the opening 14h1 and an opening 11h2 corresponding to the opening 14h2. For example, the opening 11h1 is over the opening 14h1 to expose the light emitting area 12e of the electronic component 12. For example, the opening 11h2 is over the opening 14h2 to expose the light detecting area 13e of the electronic component 13. In some embodiments, a width of the opening 11h1 is equal to or greater than the opening 14h1, and a width of the opening 11h2 is equal to or greater than the opening 14h2. Hence, a portion of a top surface of the encapsulant 14 may be exposed from the circuit layer 11 if the width of the opening 11h1 (or 11h2) is greater than that of the opening 14h1 (or 14h2).

In some embodiments, a protection layer (e.g., clear molding compound) formed of a light transparent material is disposed on the light emitting area 12e of the electronic component 12 and the light detecting area 13e of the electronic component 13. However, this will reduce the light transmittance (e.g., less than 82%). In accordance with the embodiments as illustrated in FIG. 1, the light emitting area 12e of the electronic component 12 and the light detecting area 13e are exposed from the encapsulant 14 and the circuit layer 11 (e.g., the light emitting area 12e and the light detecting area 13e are uncovered or exposed to air), which can increase the light transmittance (e.g., about 100%).

The conductive pillars 15 (e.g., copper pillars) are disposed on the surface 10l of the circuit layer 10 and electrically connect the circuit layer 11 with the circuit layer 10. For example, the conductive pillars 15 electrically connect the interconnection layer 11r exposed from the dielectric layer 11d with the interconnection layer 10r exposed from the dielectric layer 10d. The conductive pillars 15 are disposed adjacent to the electronic components 12 and 13. In some embodiments, the height of the conductive pillar 15 is about 240 micrometer.

The electrical contacts 17 (e.g. solder balls) are disposed on the surface 102 of the circuit layer 10 to provide electrical connections between the optical device 1 and external components (e.g. external circuits or circuit boards). In some embodiments, the electrical contacts 17 include a controlled collapse chip connection (C4) bump, a ball grid array (BGA) or a land grid array (LGA). In some embodiments, the electrical contacts 17, the circuit layers 10, 11 and the conductive pillars 15 provide a fan-out structure for the electronic components 12 and 13.

In some embodiments, the circuit layer 10 can be replaced by a substrate, and the electronic components 12 and 13 can be electrically connected to the substrate by wire bonding technique. However, the substrate has a relatively large area and thickness. In addition, an additional space and height are included for wire bonding loops, this would hinder the miniaturization of the optical device. In accordance with the embodiments as shown in FIG. 1, the use of the circuit layer 10 can reduce the area, the thickness and the manufacturing cost of the optical device 1.

Figure 2:
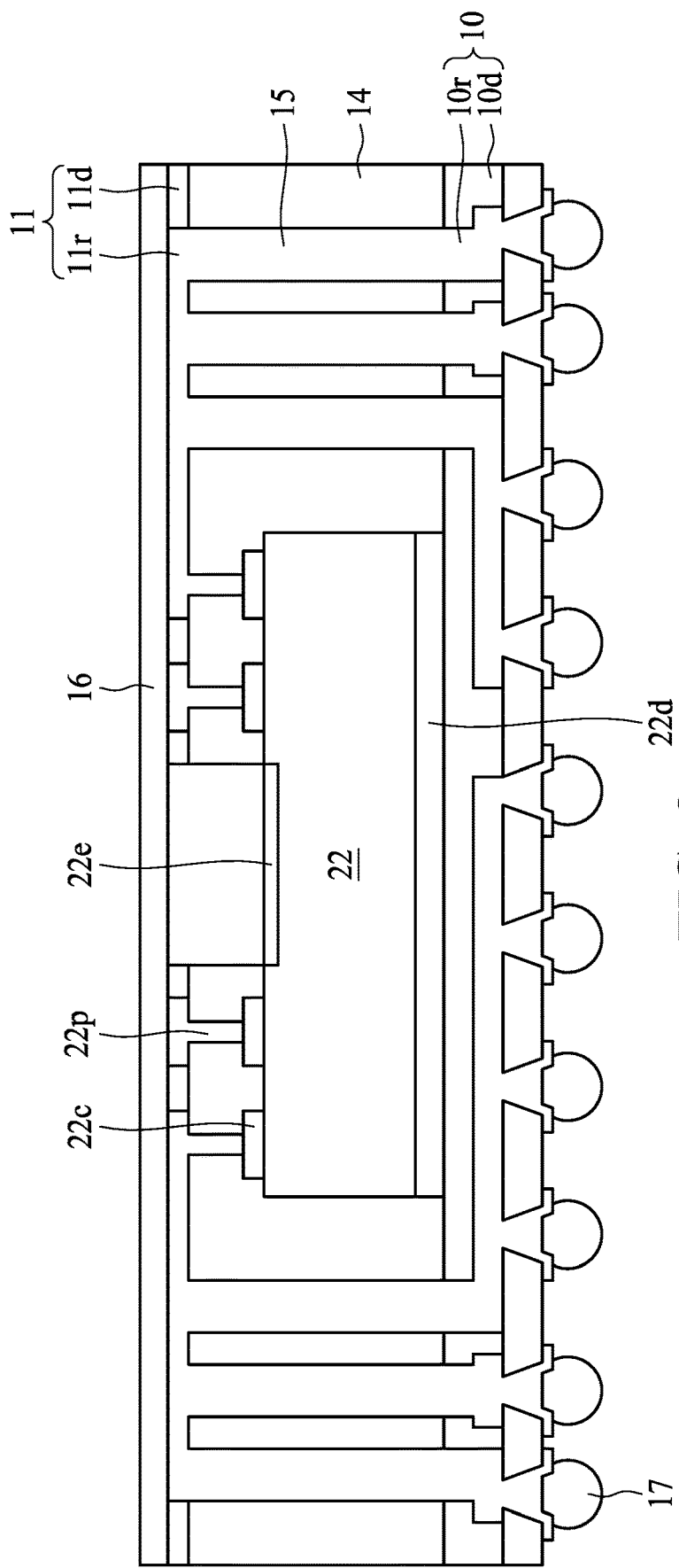
FIG. 2 illustrates a cross-sectional view of an optical device in accordance with some embodiments of the present disclosure.

FIG. 2 illustrates a cross-sectional view of an optical device 2 in accordance with some embodiments of the present disclosure. The optical device 2 in FIG. 2 is similar to the optical device 1 in FIG. 1 except that in FIG. 2, the electronic components 12 and 13 are replaced by an electronic component 22.

The electronic component 22 is disposed on the circuit layer 10. In some embodiments, a backside surface of the electronic component 22 is attached to the circuit layer 10 through a DAF 22d. The electronic component 22 has a light detecting area 22e facing away from the circuit layer 10 and configured to receive or detect a light beam. In some embodiments, the electronic component 22 may be a light detector which may be, e.g., a PIN diode, a photodiode, or a phototransistor. In some embodiments, the optical device 2 is an image sensor or any other sensors including a light detecting component.

Figure 3:
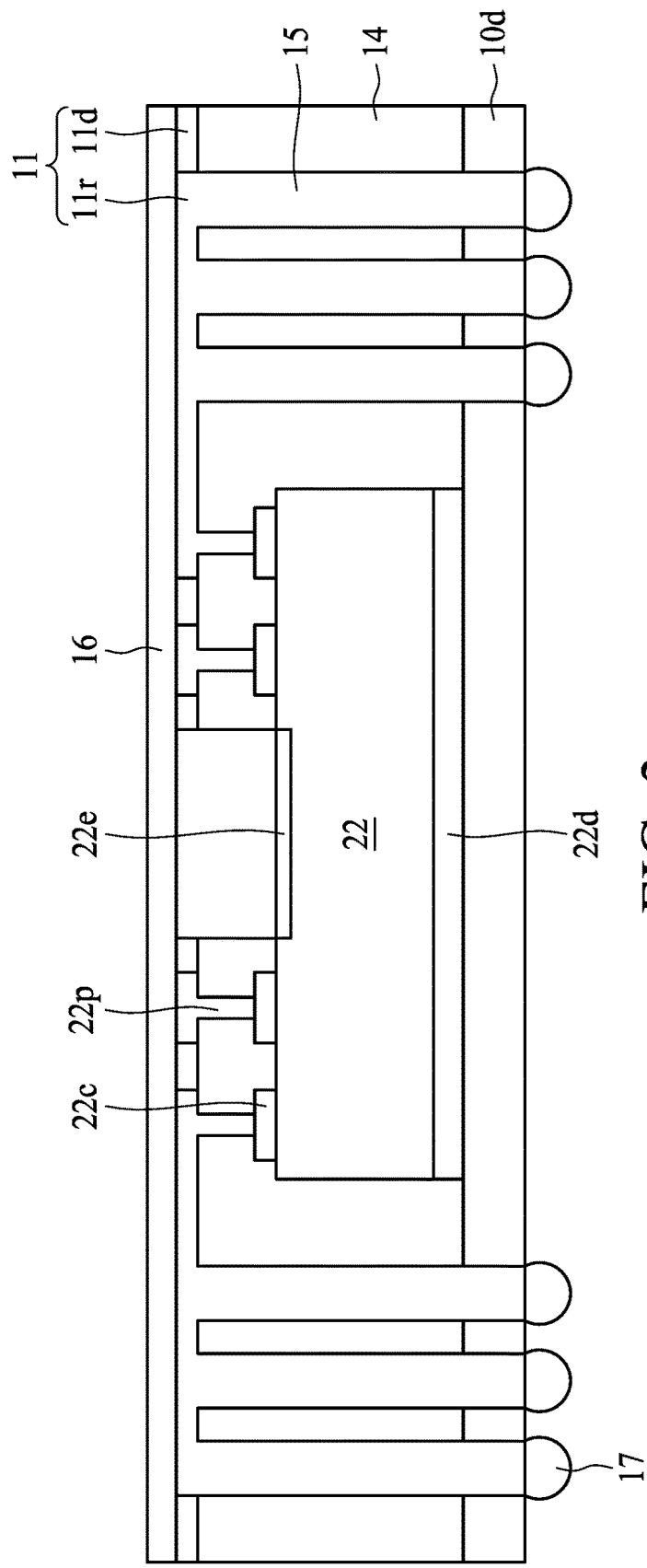
FIG. 3 illustrates a cross-sectional view of an optical device in accordance with some embodiments of the present disclosure.

FIG. 3 illustrates a cross-sectional view of an optical device 3 in accordance with some embodiments of the present disclosure. The optical device 3 in FIG. 3 is similar to the optical device 2 in FIG. 2, and the differences therebetween are described below.

The optical device 2 in FIG. 2 has the circuit layers 10 and 11 respectively disposed adjacent to the backside surface and the active surface of the electronic component 22 (e.g., on both top and bottom surfaces of the encapsulant 14) while the optical device 3 in FIG. 3 has solely one circuit layer 11 disposed adjacent to the active surface of the electronic component 22 (e.g., selectively on the top surface of the encapsulant 14). As shown in FIG. 3, the conductive pillars 15 penetrate the encapsulant 14 and the dielectric layer 10d to be electrically connected to the electrical contacts 17.

Figure 4:
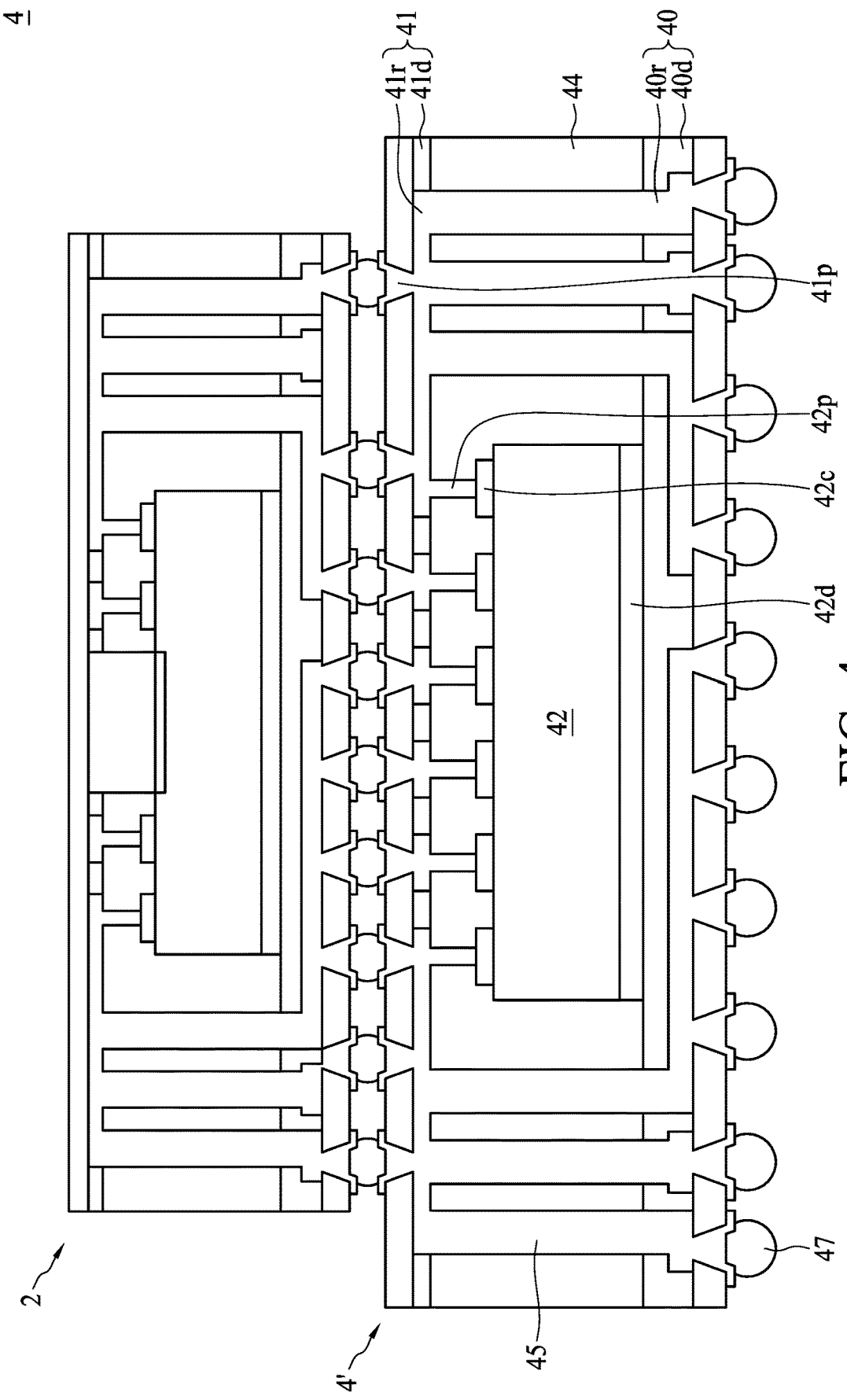
FIG. 4 illustrates a cross-sectional view of an optical module in accordance with some embodiments of the present disclosure.

FIG. 4 illustrates a cross-sectional view of an optical module 4 in accordance with some embodiments of the present disclosure. The optical device 4 includes the optical device 2 as shown in FIG. 2 and a semiconductor device package 4'. In other embodiments, the optical device 2 can be replaced by the optical device 1, 2, 3 or 5 as illustrated in FIG. 1, 2, 3 or 5 or any other optical devices. The semiconductor device package 4' includes circuit layers 40 and 41, an electronic component 42, a package body 44, conductive pillars 45 and electrical contacts 47.

The circuit layer 40 includes an interconnection layer (e.g., RDL) 40r and a dielectric layer 40d. A portion of the interconnection layer 40r is covered or encapsulated by the dielectric layer 40d while another portion of the interconnection layer 40r is exposed from the dielectric layer 40d to provide electrical connections. In some embodiments, the circuit layer 40 is similar to the circuit layer 10, and the descriptions of the circuit layer 10 can be applicable to the circuit layer 40.

The electronic component 42 is disposed on the circuit layer 10. In some embodiments, a backside surface of the electronic component 42 is attached to the circuit layer 10 through a DAF 42d. The electronic component 42 has conductive pads 42c disposed on an active surface of the electronic component 42 to provide electrical connections. Conductive pillars (e.g., copper pillars) 42p are electrically connected to the conductive pads 42c of electronic component 42. For example, the conductive pillars 42p electrically connect the conductive pads 42c with the circuit layer 41. In some embodiments, the electronic component 42 includes a control circuit or a processing circuit, such as an application-specific integrated circuit (ASIC), a microcontroller unit (MCU), a central processing unit (CPU) or any other controllers (or processors). In some embodiments, the electronic component 42 is electrically connected to the optical device 2 through the circuit layer 41 and configured to control the optical device 2 or to process the data or signal received from the optical device 2.

The package body 44 is disposed on the circuit layer 40 to cover or encapsulate the electronic component 42. In some embodiments, the package body 44 includes an epoxy resin having fillers, a molding compound (e.g., an epoxy molding compound or other molding compound), a polyimide, a phenolic compound or material, a material with a silicone dispersed therein, or a combination thereof.

The circuit layer 41 includes an interconnection layer (e.g., RDL) 41r and a dielectric layer 41d. A portion of the interconnection layer 41r is covered or encapsulated by the dielectric layer 41d while another portion of the interconnection layer 41r is exposed from the dielectric layer 41d to provide electrical connections. In some embodiments, the circuit layer 41 is similar to the circuit layer 11, and the descriptions of the circuit layer 11 can be applicable to the circuit layer 41. The optical device 2 is disposed on the circuit layer 41 and electrically connected to the electronic component 42 through the circuit layer 41 and conductive pillars 42p.

The conductive pillars 45 (e.g., copper pillars) are disposed on the circuit layer 40 and electrically connect the circuit layer 41 with the circuit layer 40. For example, the conductive pillars 45 electrically connect the interconnection layer 41r exposed from the dielectric layer 41d with the interconnection layer 40r exposed from the dielectric layer 40d. The conductive pillars 45 are disposed adjacent to the electronic component 42.

The electrical contacts 47 (e.g. solder balls) are disposed on a bottom surface of the circuit layer 10 to provide electrical connections between the optical module 4 and external components (e.g. external circuits or circuit boards). In some embodiments, the electrical contacts 47 include a C4 bump, a BGA or a LGA. In some embodiments, the electrical contacts 47, the circuit layers 40, 41 and the conductive pillars 45 provide a fan-out structure for the electronic component 42.

Figure 5:
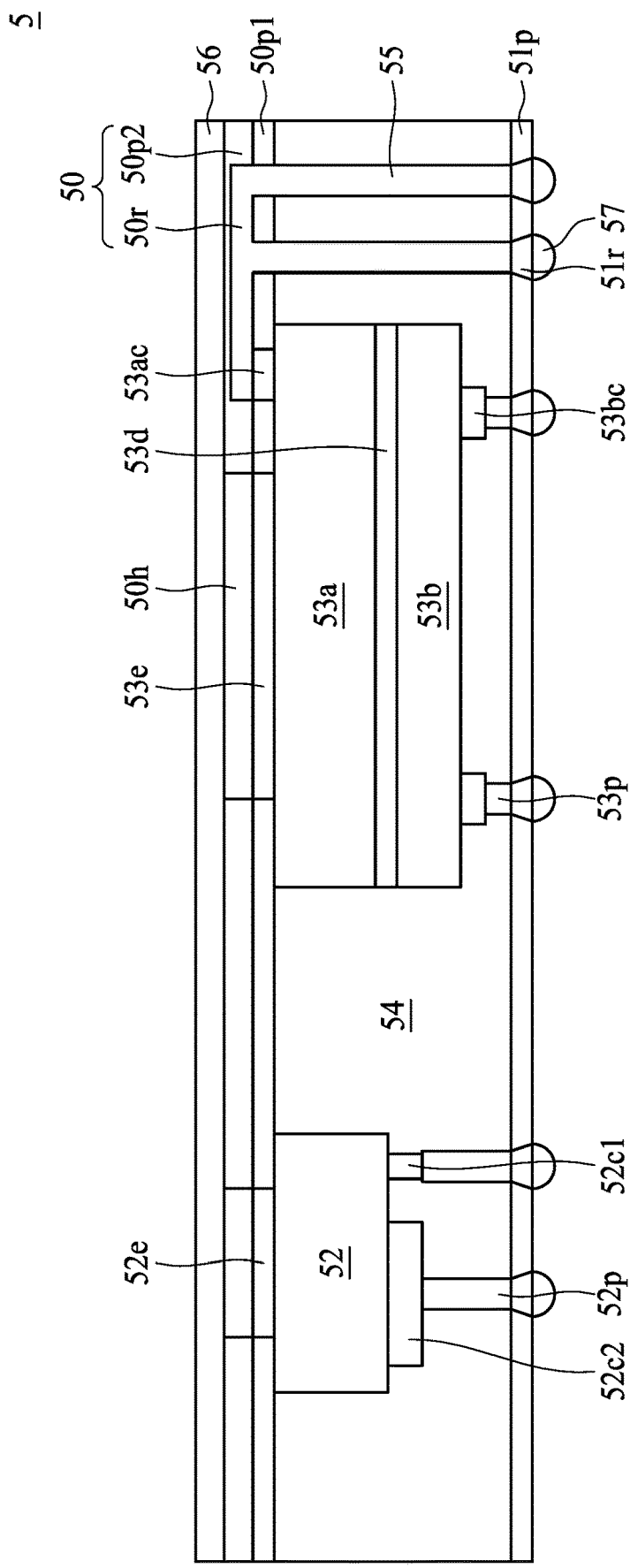
FIG. 5 illustrates a cross-sectional view of an optical device in accordance with some embodiments of the present disclosure.

FIG. 5 illustrates a cross-sectional view of an optical device 5 in accordance with some embodiments of the present disclosure. The optical device 5 includes a circuit layer 50, electronic components 52, 53a, 53b, an encapsulant 54, conductive pillars 55, a film 56 and electrical contacts 57.

The electronic component 52 has a light emitting area 52e facing the circuit layer 10 and configured to emit a light beam toward an object. The light emitting area 52e is located on or adjacent to a backside surface of the electronic component 52. In some embodiments, the electronic component 52 may be a light emitter or a light emitting device, such as a light-emitting diode (LED) or other light emitting die. For example, the electronic component 52 may include, e.g., an LED, a laser diode, another device that may include one or more semiconductor layers, or a combination of two or more thereof. The semiconductor layers may include silicon, silicon carbide, gallium nitride, or any other semiconductor materials.

The electronic component 52 has conductive pads 52c1 and 52c2 (e.g., P-terminal and N-terminal) disposed on an active surface of the electronic component 52 to provide electrical connections. As shown in FIG. 5, the conductive pads 52c1, 52c2 and the light emitting area 52e are disposed at different surfaces of the electronic component 52. In some embodiments, the conductive pads 52c1 and 52c2 have different sizes. Conductive pillars (e.g., copper pillars) 52p are electrically connected to the conductive pads 52c1 and 52c2 of electronic component 52.

The electronic component 53a has a light detecting area 53e facing the circuit layer 10 and configured to receive or detect a light beam reflected from the object. The light detecting area 53e is located on or adjacent to an active surface of the electronic component 53a. In some embodiments, the electronic component 53a may be a light detector which may be, e.g., a PIN diode, a photodiode, or a phototransistor. In some embodiments, the optical device 5 may act as a proximity sensor or any other sensors including a light emitting component and a light detecting component.

The electronic component 53a has conductive pads 53ac disposed on the active surface of the electronic component 53a to provide electrical connections. In some embodiments, the conductive pads 53ac and the light detecting area 53e are disposed at or adjacent to the active surface of the electronic component 53a. The conductive pads 53ac may disposed adjacent to edges of the active surface of the electronic component 53a while the light emitting area 53e may be disposed at or adjacent to the center of the active surface of the electronic component 53a.

The electronic component 53b is disposed on the backside surface of the electronic component 53a. In some embodiments, a backside surface of the electronic component 53b is attached to the backside surface of the electronic component 53a through a DAF 53d. The electronic component 53b has conductive pads 53bc disposed on an active surface of the electronic component 53b to provide electrical connections. Conductive pillars (e.g., copper pillars) 53p are electrically connected to the conductive pads 53bc of electronic component 53b. In some embodiments, the electronic component 53b includes a control circuit or a processing circuit, such as an ASIC, a MCU, a CPU or any other controllers (or processors).

The circuit layer 50 includes an interconnection layer (e.g., RDL) 50r and dielectric layers 50p1 and 50p2. The dielectric layer 50p1 covers a portion of the backside surface of the electronic component 52 and exposes the light emitting area 52e of the electronic component 52. The dielectric layer 50p1 covers a portion of the backside surface of the electronic component 52 and exposes the light detecting area 53e and the conductive pads 53ac of the electronic component 53a. A portion of the interconnection layer 50r is covered or encapsulated by the dielectric layer 50d2 while another portion of the interconnection layer 50r is exposed from the dielectric layer 50d2 to provide electrical connections. For example, the interconnection layer 50r exposed from the dielectric layer 50d2 is electrically connected to the electronic component 53a. For example, the interconnection layer 50r exposed from the dielectric layer 50d2 is in contact with the conductive pads 53ac of the electronic component 53a. The conductive pillars 55 (e.g., copper pillars) are electrically connect to the circuit layer 50 (e.g., to the interconnection layer 50r).

The dielectric layer s 50p1 and 50p2 have openings 50h to expose the light emitting area 52e and the light detecting area 53e. For example, the light emitting area 52e and the light detecting area 53e are uncovered or exposed to air, which can increase the light transmittance (e.g., about 100%). In some embodiments, the circuit layer 50 is similar to the circuit layer 10, and the descriptions of the circuit layer 10 can be applicable to the circuit layer 50. In some embodiments, the film 56 (e.g., IR pass filter film) is disposed on the circuit layer 50. In other embodiments, the film 56 can be omitted depending on different specifications.

The encapsulant 54 covers the electronic components 52, 53a, 53b and the conductive pillars 55. The encapsulant 54 is formed of or includes an opaque material or a light absorbing material to avoid the light emitted from the electronic component 52 from directly entering the light detecting area 53e of the electronic component 53a. This can mitigate or eliminate the cross-talk issue between the electronic components 52 and 53a. In some embodiments, the encapsulant 54 may include OD 4 materials, such as black molding compound.

Conductive pads 51r are electrically connected to the conductive pillars 52p, 53p and 55. A dielectric layer 51p is disposed on a bottom surface of the encapsulant 54. The dielectric layer 51p covers a portion of the conductive pads 51r and exposes the other portion of the conductive pads 51r for electrical connections. The electrical contacts 57 (e.g. solder balls) are disposed on the exposed portion of the conductive pads 51r to provide electrical connections between the optical device 5 and external components (e.g.

external circuits or circuit boards). In some embodiments, the electrical contacts 57 include a C4 bump, a BGA or a LGA.

FIG. 6A, FIG. 6B, FIG. 6C, FIG. 6D, FIG. 6E, FIG. 6F and FIG. 6G illustrate a method for manufacturing an optical device according to some embodiments of the present disclosure. In some embodiments, the method illustrated in FIG. 6A, FIG. 6B, FIG. 6C, FIG. 6D, FIG. 6E, FIG. 6F and FIG. 6G can be used to manufacture the optical device 1 in FIG. 1. In other embodiments, the method illustrated in FIG. 6A, FIG. 6B, FIG. 6C, FIG. 6D, FIG. 6E, FIG. 6F and FIG. 6G can be used to manufacture other optical devices (e.g., the optical device 2, 3 or 4) through some modifications.

Figure 6A:
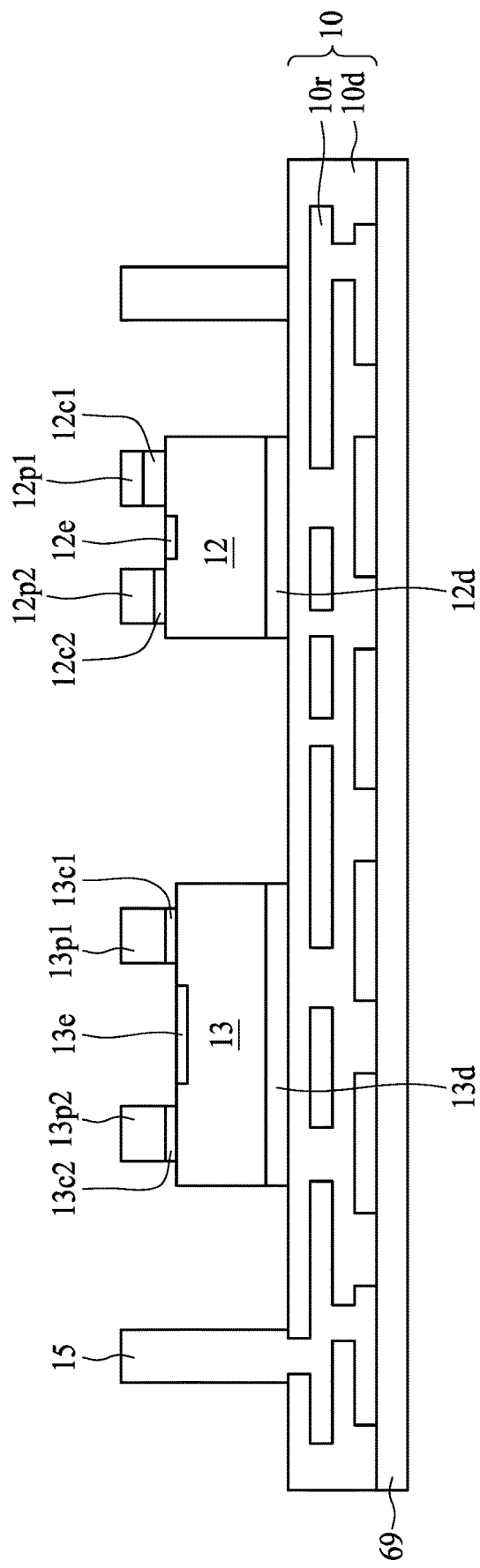
FIG. 6A, FIG. 6B, FIG. 6C, FIG. 6D, FIG. 6E, FIG. 6F and FIG. 6G illustrate a method for manufacturing an optical device in accordance with some embodiments of the present disclosure.

Referring to FIG. 6A, a carrier 69 is provided. The carrier 69 may have an adhesive layer (e.g., adhesive film or tape) thereon. The circuit layer 10 including the dielectric layer 10d and the interconnection layer 10r is formed on the carrier 69. In some embodiments, the circuit layer 10 can be formed by lithographic techniques. The conductive pillars 15 are formed on the circuit layer 10. The electronic components 12 and 13 are then disposed on the circuit layer 10. In some embodiments, the order for disposing the electronic components 12, 13 and the conductive pillars 15 can be adjusted depending on different design specifications. In some embodiments, backside surfaces of the electronic components 12 and 13 are attached to the circuit layer 10 through DAFs 12d and 13d.

The light emitting area 12e of the electronic component 12 and the light detecting area 13e of the electronic component 13 face away from the circuit layer 10. The active surfaces of the electronic components 12 and 13 facing away from the circuit layer 10. The conductive pillars 12p1 and 12p2 are formed on the conductive pads 12c1 and 12c2 of the electronic component 13. The conductive pillars 13p1 and 13p2 are formed on the conductive pads 13c1 and 13c2 of the electronic component 13. In some embodiments, the conductive pillars 12p1, 12p2, 13p1, 13p2 and 15 are formed by plating or any other suitable processes.

Figure 6B:
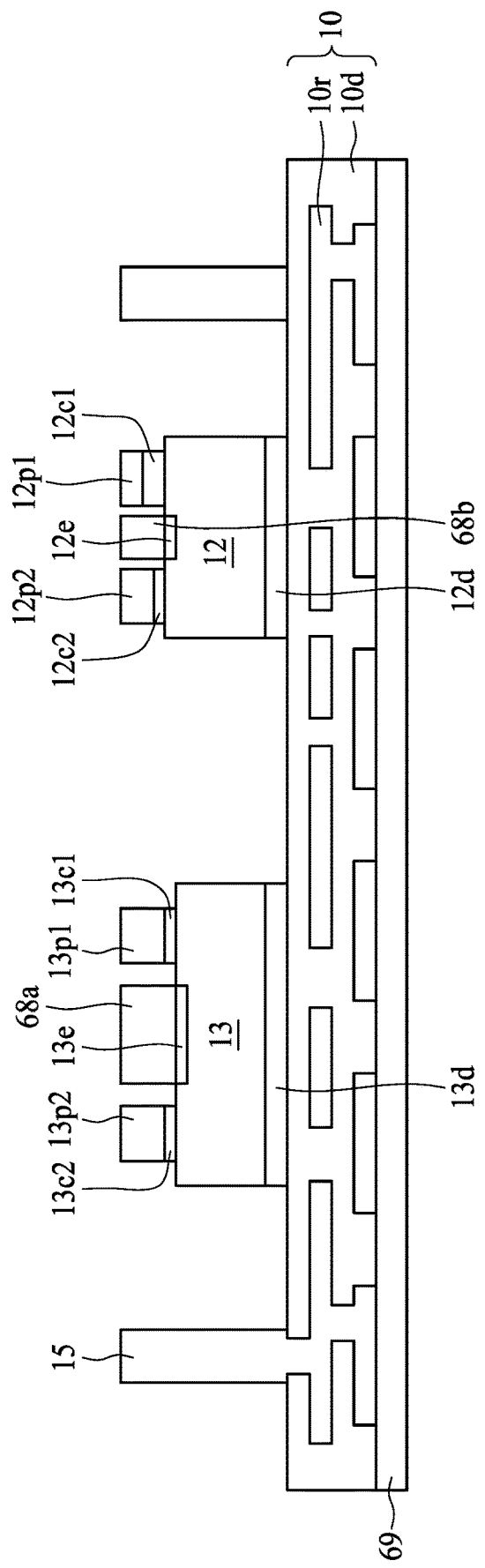

Referring to FIG. 6B, a protection film 68a is formed on the light detecting area 13e of the electronic component 13 and a protection film 68b is formed on the light emitting area 12e of the electronic component 13. The protection films 68a and 68b fully cover the light detecting area 13e and the light emitting area 12e. In some embodiments, the protection films 68a and 68b are formed of or include Silicone, Polyurethane (PU), Polydimethylsiloxane (PDMS) or any other suitable materials.

Figure 6C:
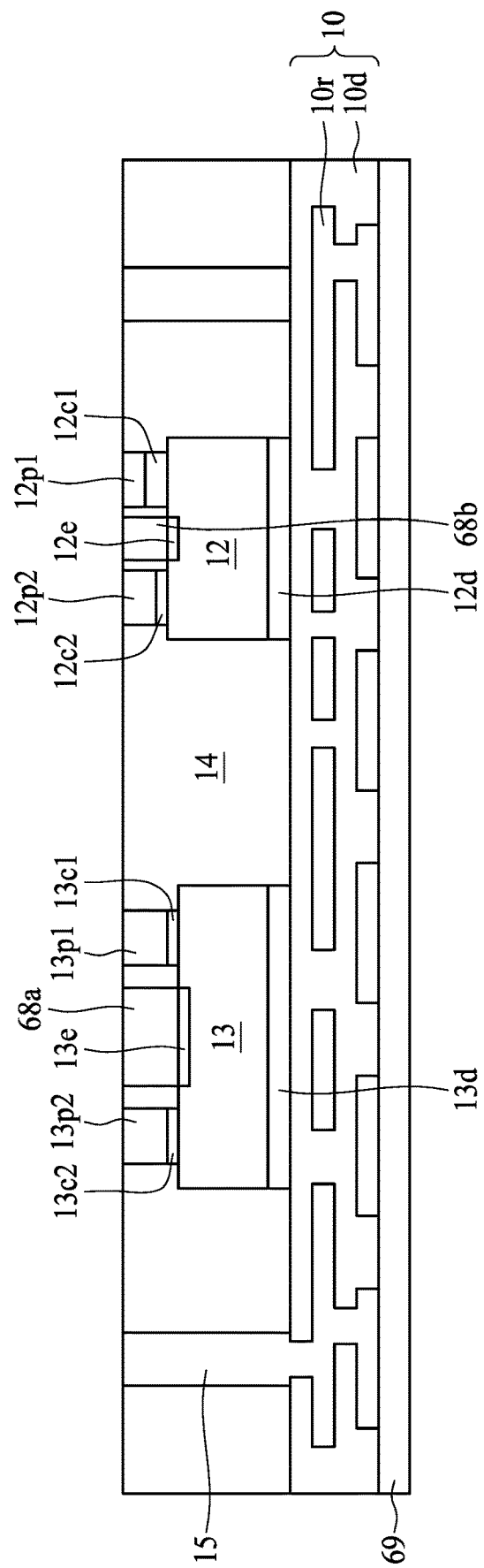

Referring to FIG. 6C, the encapsulant 14 is formed on the circuit layer 10 to cover the electronic components 12, 13, the conductive pillars 12c1, 12c2, 13c1, 13c2, 15 and the protection films 68a, 68b. In some embodiments, the encapsulant 14 may fully cover the electronic components 12, 13, the conductive pillars 12c1, 12c2, 13c1, 13c2, 15 and the protection films 68a, 68b, and a portion of the encapsulant 14 is removed by, for example, grinding to expose top portions of the conductive pillars 12c1, 12c2, 13c1, 13c2, 15 and the protection films 68a, 68b. In some embodiments, the encapsulant 14 may be formed by lamination or molding techniques.

Figure 6D:
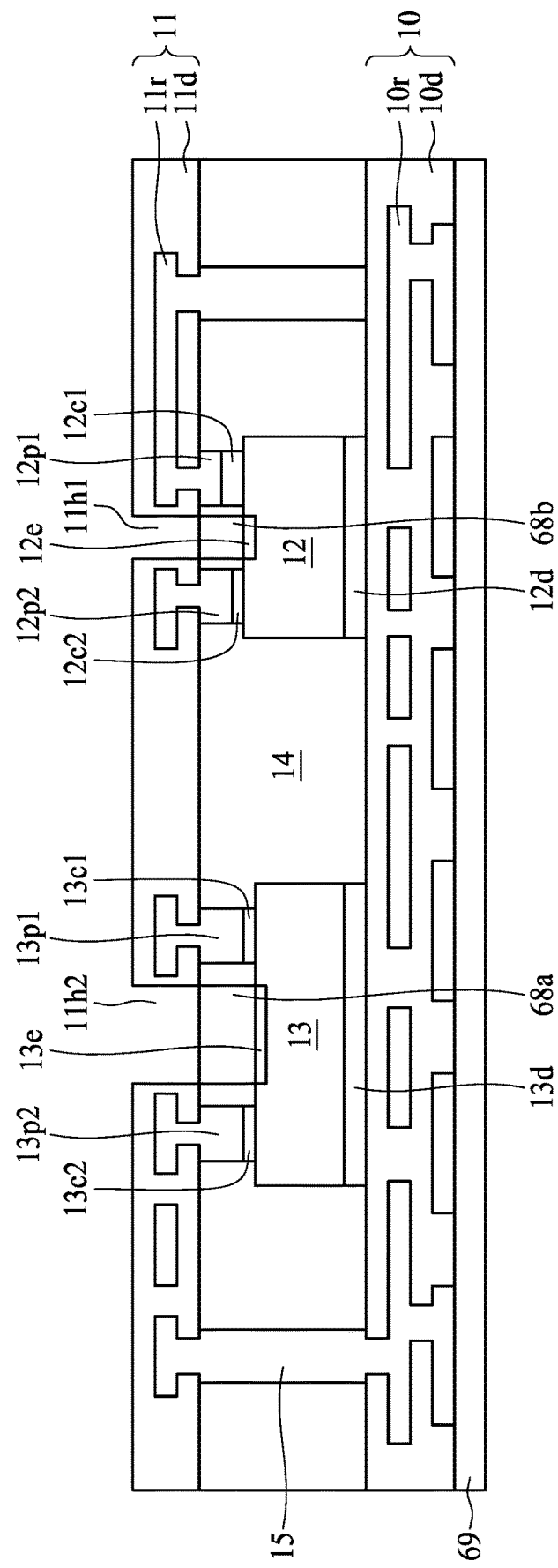

Referring to FIG. 6D, the circuit layer 11 having the interconnection layer 11r and the dielectric layer 11d is formed on the encapsulant 14. The interconnection layer 11r is electrically connected to the exposed portion of the conductive pillars 12c1, 12c2, 13c1, 13c2 and 15. The dielectric layer 11d includes openings 11h1 and 11h2 to expose the protection films 68b and 68a. In some embodiments, the opening 11h1 has a width equal to or greater than a width of the protection film 68b, and the opening 11h2 has a width equal to or greater than a width of the protection film 68a. Hence, a portion of a top surface of the encapsulant 14 may be exposed from the dielectric layer 11d if the width of the opening 11h1 (or 11h2) is greater than that of the protection film 68b (or 68a). In some embodiments, the circuit layer 11 is formed by lithographic techniques.

Figure 6E:
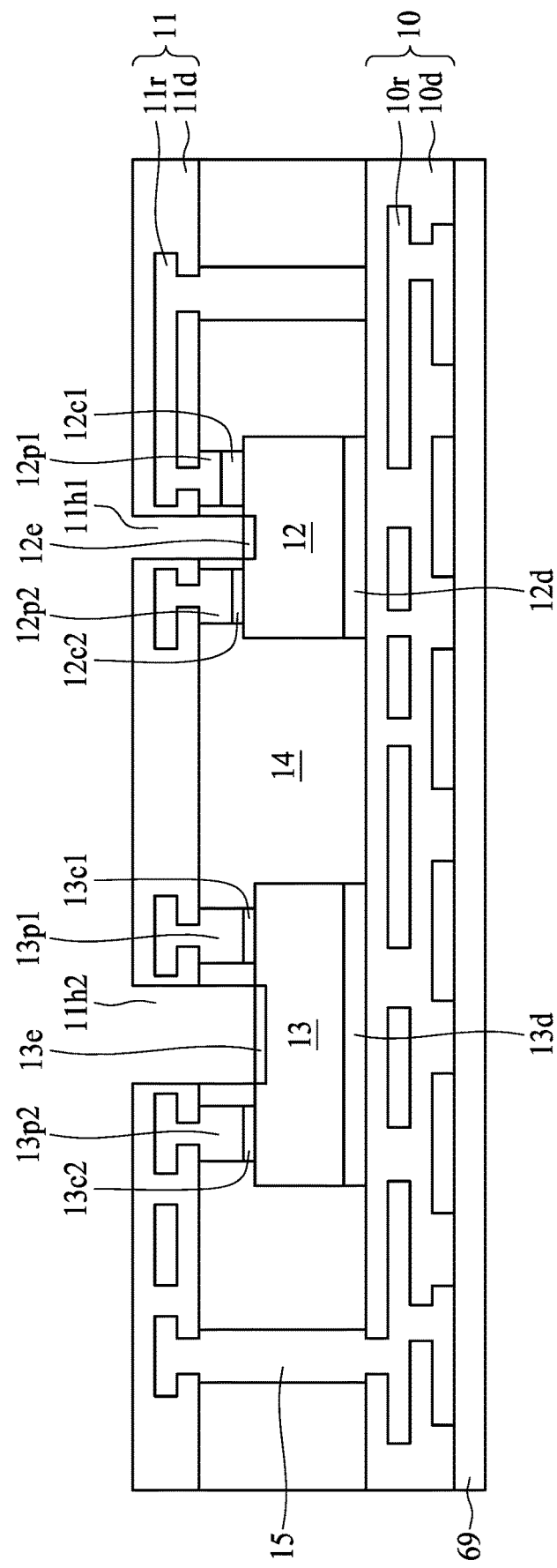
Figure 6F:
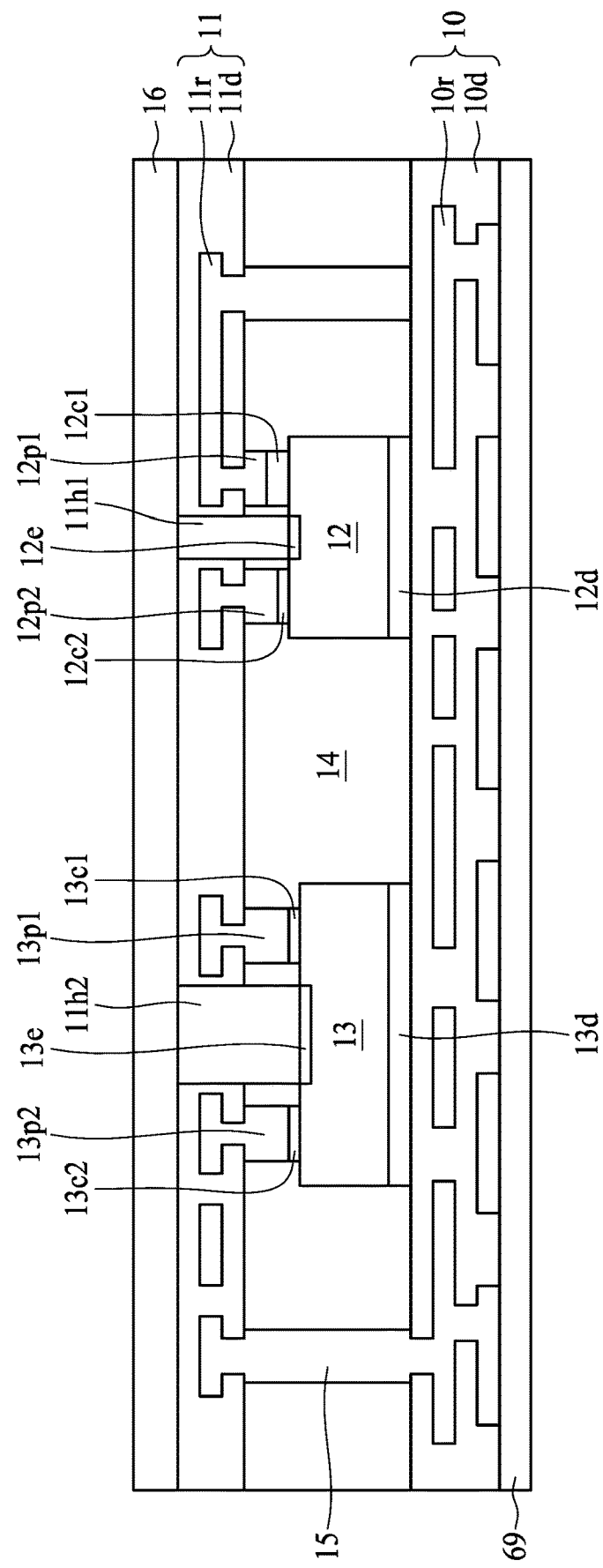

Referring to FIG. 6E, the protection films 68a and 68b are removed to expose the light detecting area 13e of the electronic component 13 and the light emitting area 12e of the electronic component 12. Then, the film (e.g., IR pass filter film) 16 is formed on the circuit layer 11 by, for example, jet-printing or any other suitable processes as shown in FIG. 6F. In some embodiments, the operation in FIG. 6F can be omitted depending on different design specifications.

Figure 6G:
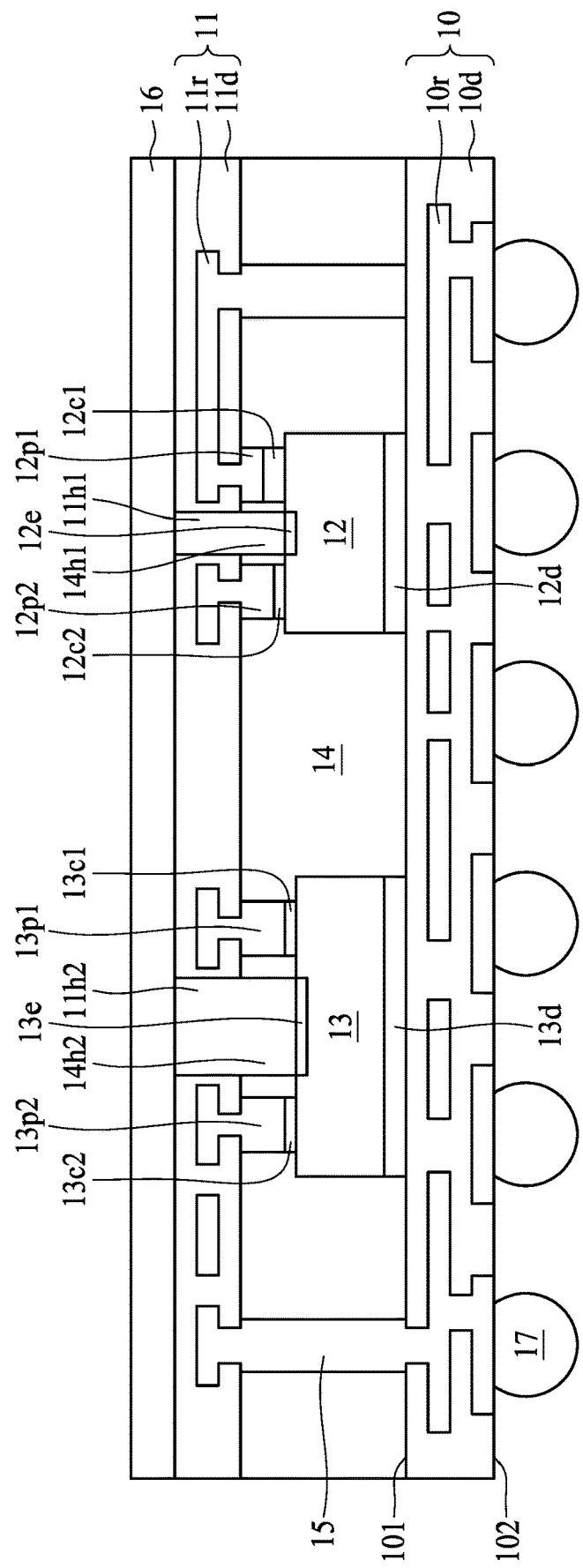

Referring to FIG. 6G, the carrier 69 (and the adhesive layer) is removed from the circuit layer 10 to expose a portion of the interconnection layer 10r. The electrical contacts 17 (e.g., solder balls) are disposed on the exposed portion of the interconnection layer 10r to form the optical device 1 as shown in FIG. 1. In some embodiments, the electrical contacts 17 may be disposed by, for example, ball mount techniques. In some embodiments, singulation may be performed to separate out individual optical devices by, for example, using a dicing saw, laser or other appropriate cutting technique.

In some embodiments, the optical device 2 as shown in FIG. 2 can be manufactured by the operations as shown in FIG. 6A, FIG. 6B, FIG. 6C, FIG. 6D, FIG. 6E, FIG. 6F and FIG. 6G, if the electronic components 12 and 13 are replaced by the electronic component 22 in the operation as shown in FIG. 6A. In some embodiments, the optical device 3 as shown in FIG. 3 can be manufactured by the operations as shown in FIG. 6A, FIG. 6B, FIG. 6C, FIG. 6D, FIG. 6E, FIG. 6F and FIG. 6G, if the electronic components 12 and 13 are replaced by the electronic component 22 and the operation for forming the interconnection layer 10r is omitted in the operation as shown in FIG. 6A. In some embodiments, the optical device 4 as shown in FIG. 4 can be manufactured by the operations as shown in FIG. 6A, FIG. 6B, FIG. 6C, FIG. 6D, FIG. 6E, FIG. 6F and FIG. 6G, if the optical device 1 as shown in FIG. 6G is further disposed on the semiconductor device package 4' as shown in FIG. 4.

FIG. 7A, FIG. 7B, FIG. 7C, FIG. 7D, FIG. 7E, FIG. 7F, FIG. 7G, FIG. 7H and FIG. 7I illustrate a method for manufacturing an optical device according to some embodiments of the present disclosure. In some embodiments, the method illustrated in FIG. 7A, FIG. 7B, FIG. 7C, FIG. 7D, FIG. 7E, FIG. 7F, FIG. 7G, FIG. 7H and FIG. 7I can be used to manufacture the optical device 5 in FIG. 5. In other embodiments, the method illustrated in FIG. 7A, FIG. 7B, FIG. 7C, FIG. 7D, FIG. 7E, FIG. 7F, FIG. 7G, FIG. 7H and FIG. 7I can be used to manufacture other optical devices through some modifications.

Figure 7A:
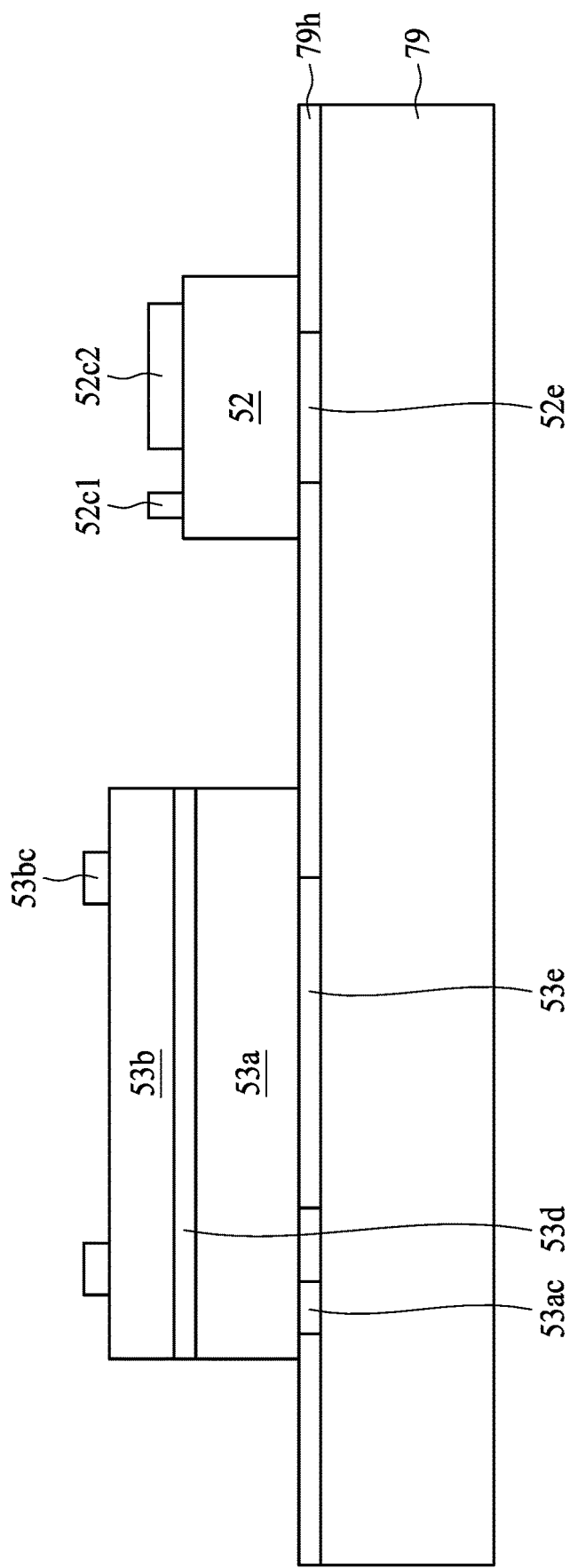
FIG. 7A, FIG. 7B, FIG. 7C, FIG. 7D, FIG. 7E, FIG. 7F, FIG. 7G, FIG. 7H and FIG. 7I illustrate a method for manufacturing an optical device in accordance with some embodiments of the present disclosure.

Referring to FIG. 7A, a carrier 79 is provided. The carrier 79 may have an adhesive layer 79h (e.g., adhesive film or tape) thereon. The electronic components 52 and 53a are then disposed on the adhesive layer 79h. In some embodiments, the light emitting area 52e (e.g., the backside surface) of the electronic component 52 and the light detecting area 53e and the conductive pads 53ac (e.g., the active surface) of the electronic component 53 face the carrier 79 and are attached to the carrier 79 through the adhesive layer 79h. The conductive pads 52c1 and 52c2 (e.g., the active surface) of the electronic component 52 face away from the carrier 79. The electronic component 53b is then disposed on the electronic component 52s. In some embodiments, the backside surface of the electronic component 53b is attached to the backside surface of the electronic component 53a through the DAF 53d. The electronic component 53b has conductive pads (e.g., the active surface) face away from the carrier 79.

Figure 7B:
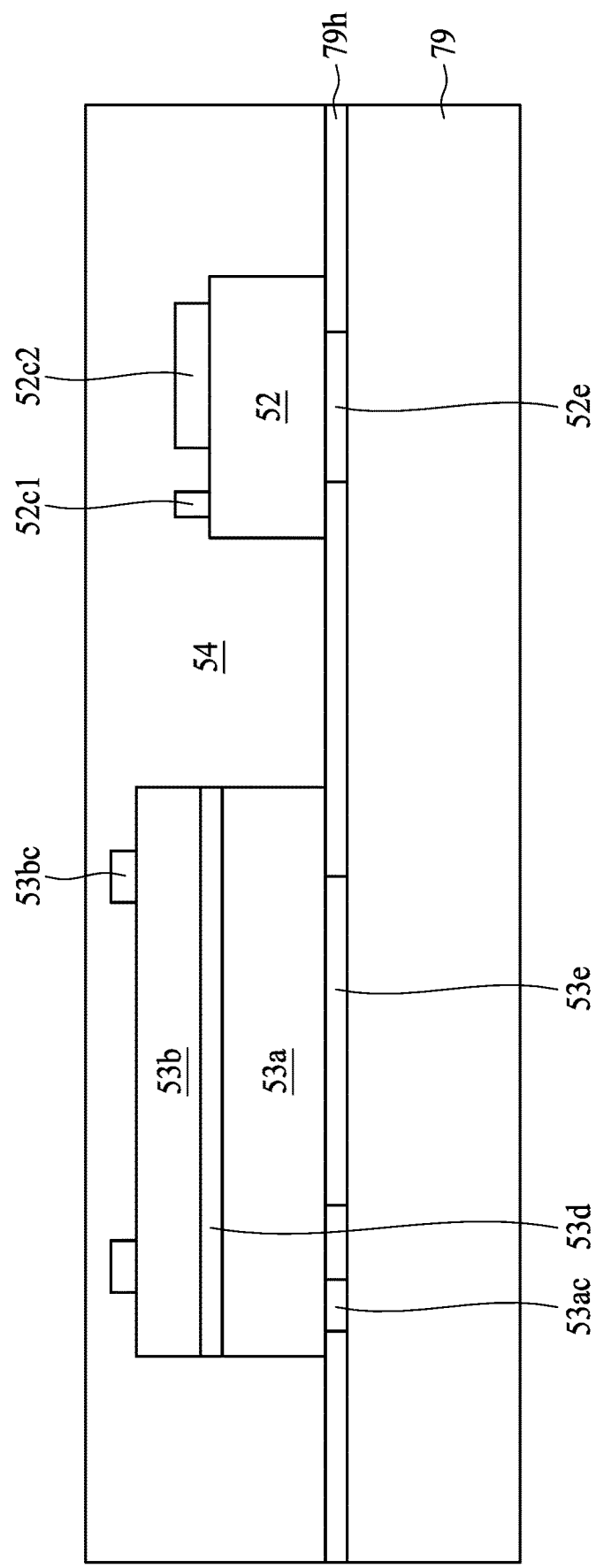

Referring to FIG. 7B, the encapsulant 54 is formed on the carrier 79 to cover the electronic components 52, 53a and 53b. In some embodiments, the encapsulant 54 may be formed by molding techniques (e.g., transfer molding, compression molding or the like) or any other suitable processes.

Figure 7C:
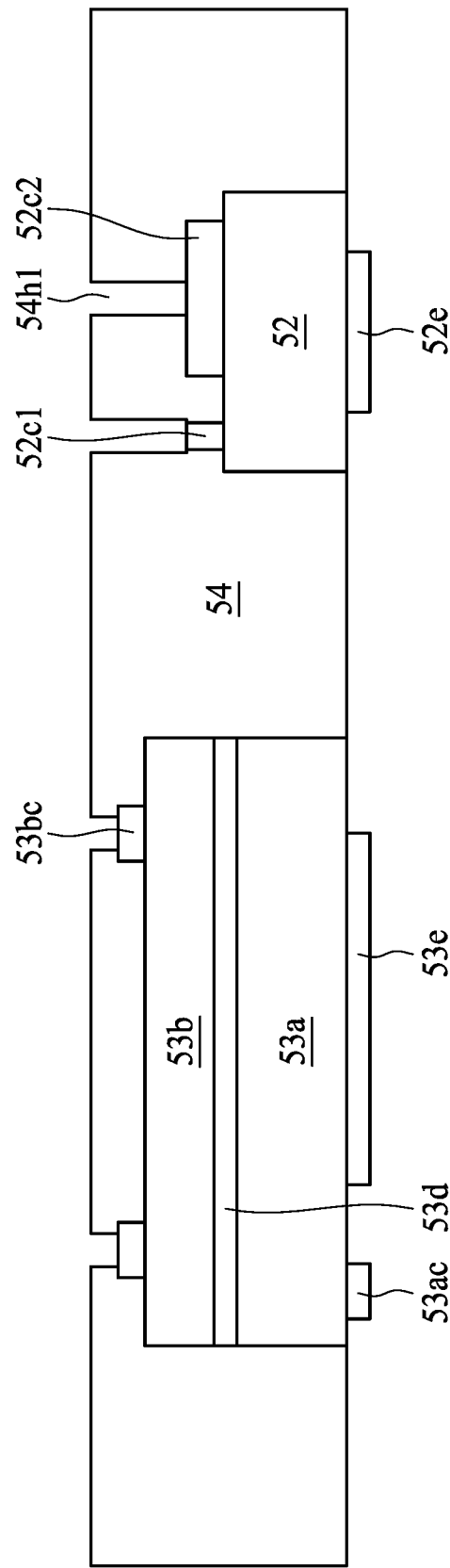

Referring to FIG. 7C, openings 54h1 are formed to penetrate the encapsulant 54 to expose the conductive pads 52c1, 52c2, 53bc of the electronic components 52 and 53b. The carrier 79 (and the adhesive layer 79h) is then removed.

Figure 7D:
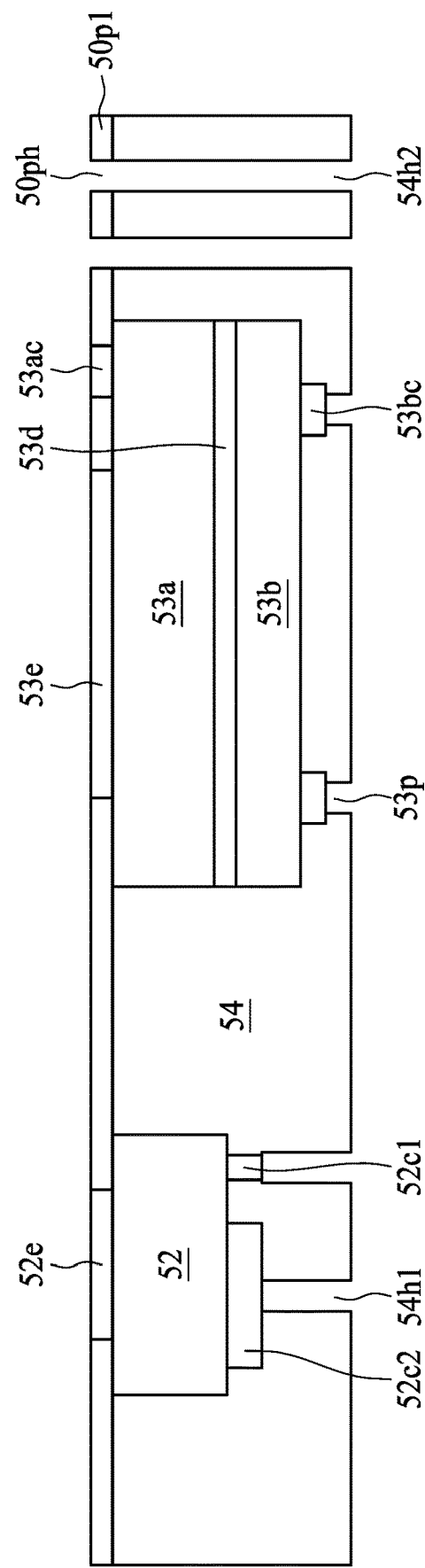

Referring to FIG. 7D, the dielectric layer 50p1 is formed on the encapsulant 54. Openings 50ph (e.g., through holes) are formed to penetrate the dielectric layer 50p1, and openings 54h2 (e.g., through holes) are formed to penetrate the encapsulant 54. The openings 50ph are connected to the openings 54h2. The light detecting area 53e and the conductive pads 53ac of the electronic component 53a and the light emitting area 52e of the electronic component 52 are exposed from the dielectric layer 50p1.

Figure 7E:
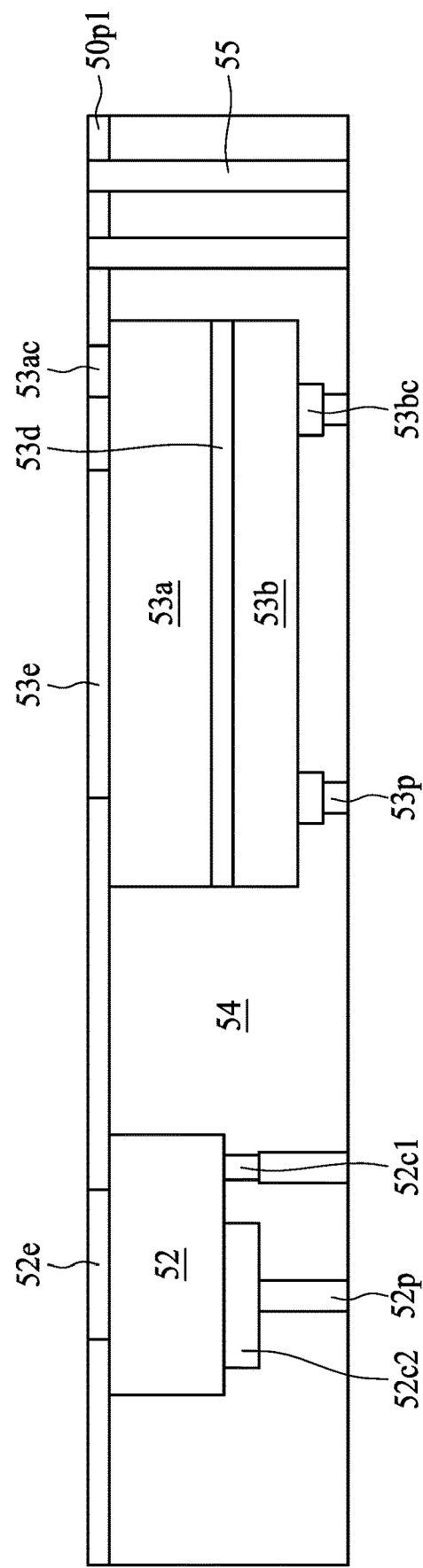

Referring to FIG. 7E, the openings 54h1, 54h2 and 50ph are filled with a conductive material to form the conductive pillars 52p, 53p and 55. The conductive pillars 52p are connected to the conductive pads 52c1 and 52c2 of the electronic component 52. The conductive pillars 53p are connected to the conductive pads 53bc of the electronic component 53b. In some embodiments, the conductive pillars 52p, 53p and 55 may be formed by plating or any other suitable processes.

Figure 7F:
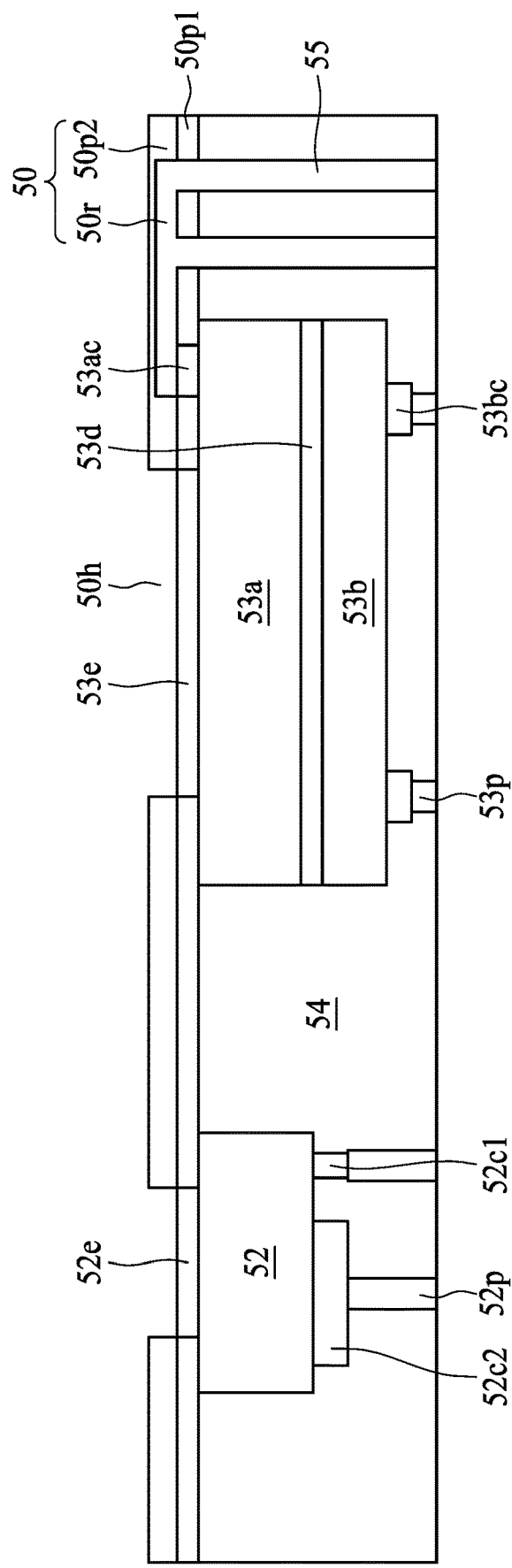

Referring to FIG. 7F, the circuit layer 50 having the interconnection layer 50r and the dielectric layer 50p2 is formed on the dielectric layer 50p1. The interconnection layer 50r is electrically connected to the conductive pads 53ac of the electronic component 53a and the conductive pillars 55. The dielectric layer 50p2 has openings 50h to expose the light emitting area 52e of the electronic component 52 and the light detecting area 53e of the electronic component 53. In some embodiments, the circuit layer 50 may be formed by lithographic techniques.

Figure 7G:
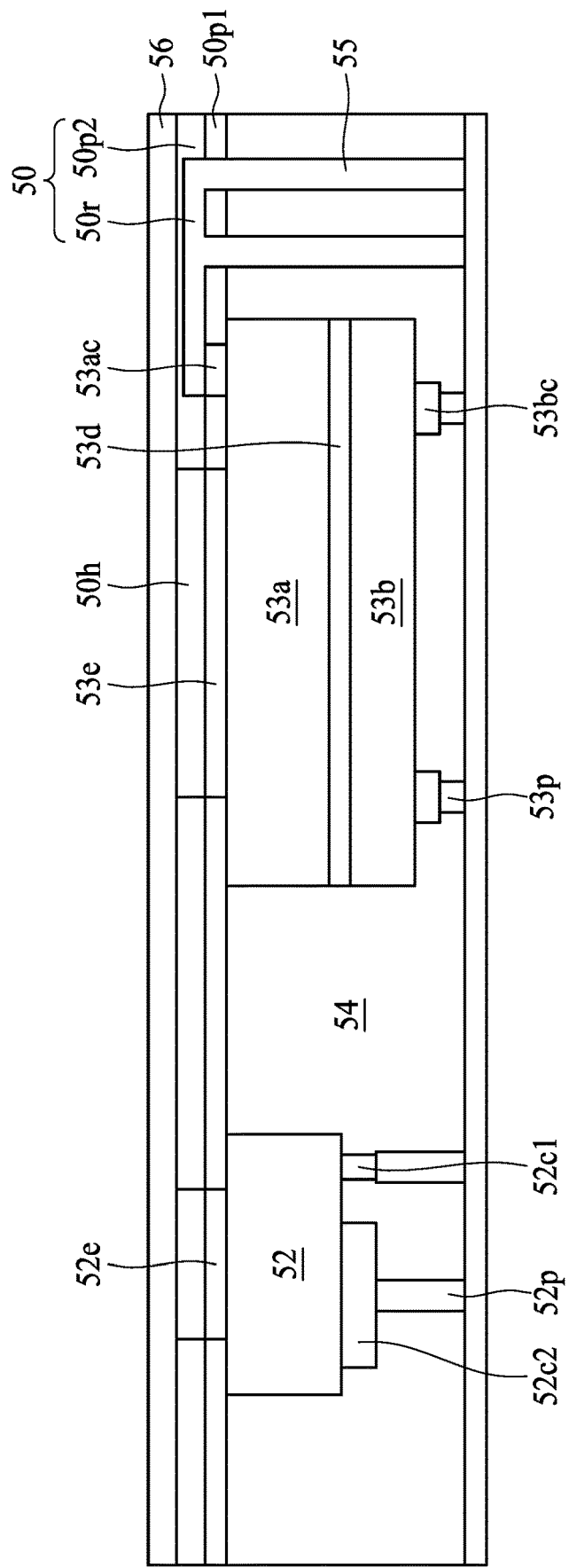

Referring to FIG. 7G, the film (e.g., IR pass filter film) 56 is formed on the circuit layer 50 by, for example, jet-printing or any other suitable processes. In some embodiments, the operation in FIG. 7G can be omitted depending on different design specifications.

Figure 7H:
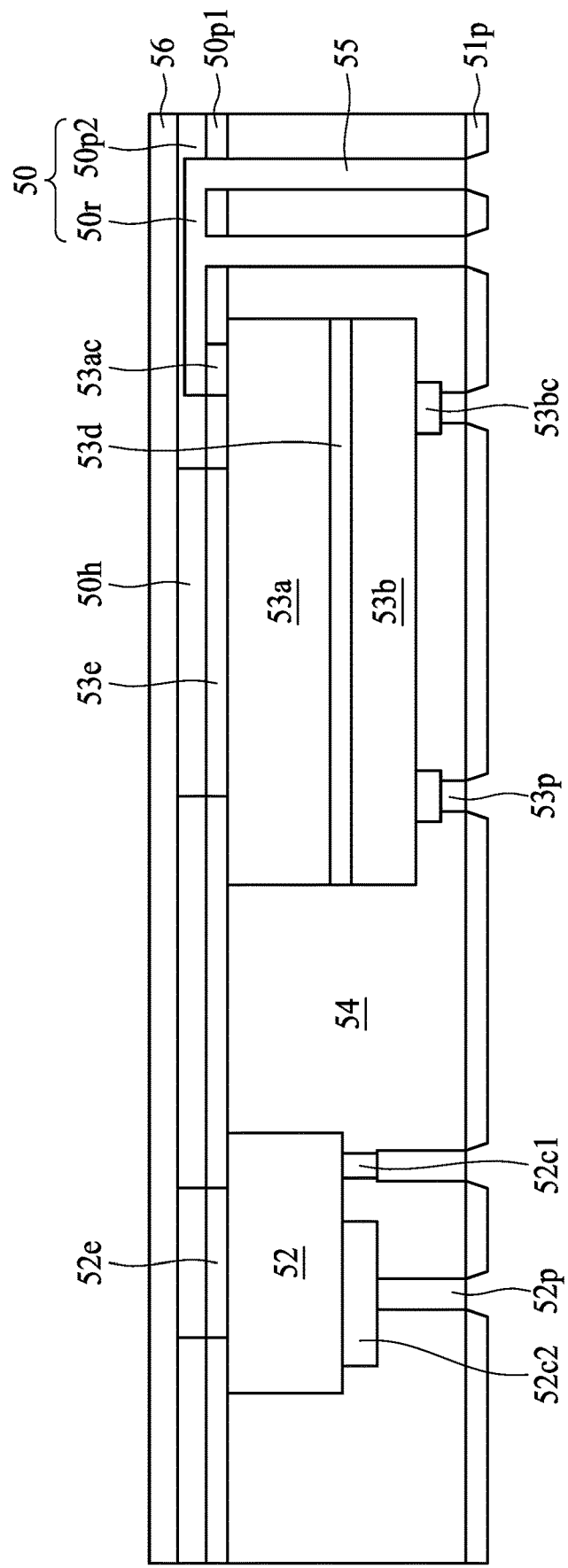

Referring to FIG. 7H, the dielectric layer 51p is formed on a surface (facing away from the circuit layer 50) of the encapsulant 54. The dielectric layer 51p has openings (through holes) to expose a portion of the conductive pillars 52p, 53p and 55 for electrical connections.

Figure 7I:
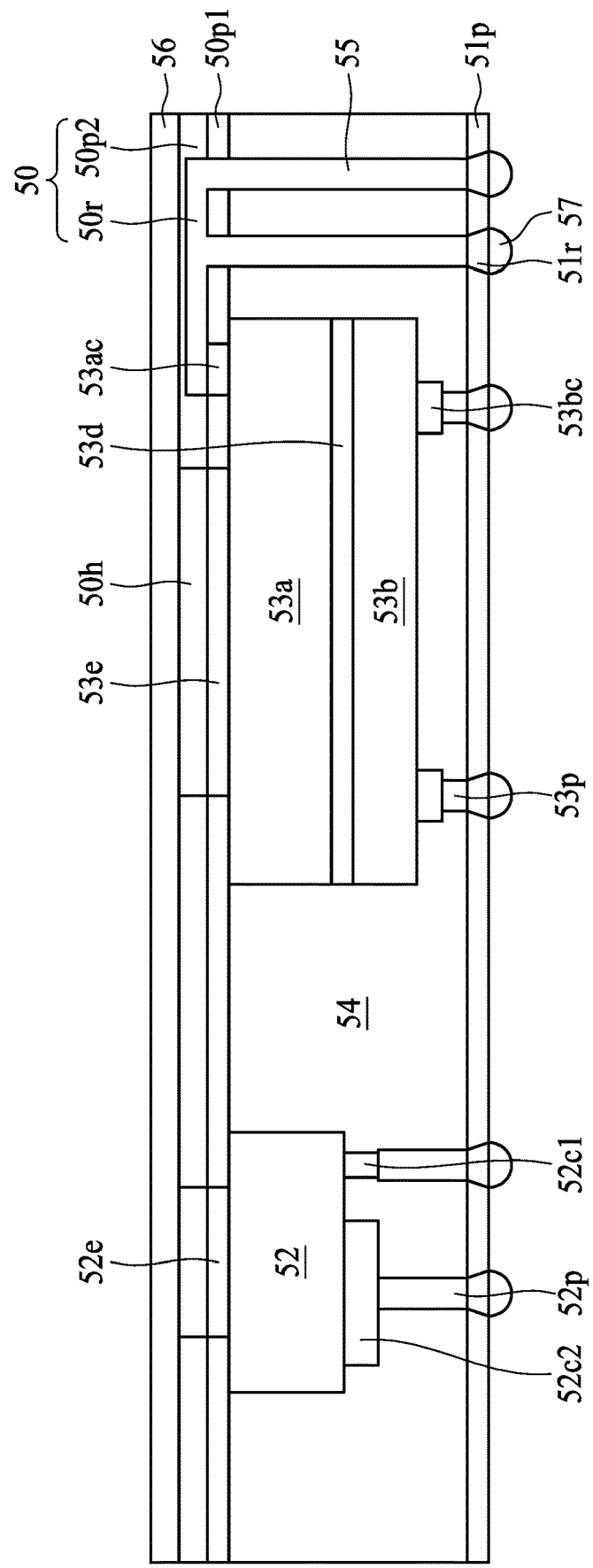

Referring to FIG. 7I, a conductive material 51r is formed within the openings of the dielectric layer 51p to be electrically connect to the exposed portion of the conductive pillars 52p, 53p and 55. The conductive material 51r may be formed by, for example, plating or any other suitable processes. The electrical contacts 57 (e.g., solder balls) are then disposed on the conductive material 51r to form the optical device 5 as shown in FIG. 5. In some embodiments, the electrical contacts 57 may be disposed by, for example, ball mount techniques. In some embodiments, singulation may be performed to separate out individual optical devices by, for example, using a dicing saw, laser or other appropriate cutting technique.

In the description of some embodiments, a component provided "on" another component can encompass cases where the former component is directly on (e.g., in physical contact with) the latter component, as well as cases where one or more intervening components are located between the former component and the latter component.

In the description of some embodiments, a component characterized as "light transmitting" or "transparent" can refer to such a component as having a light transmittance of at least 80%, such as at least 85% or at least 90%, over a relevant wavelength or a relevant range of wavelengths, such as a peak infrared wavelength or a range of infrared wavelengths emitted by a light emitter. In the description of some embodiments, a component characterized as "light shielding," "light blocking," or "opaque" can refer to such a component as having a light transmittance of no greater than 20%, such as no greater than 15% or no greater than 10%, over a relevant wavelength or a relevant range of wavelengths, such as a peak infrared wavelength or a range of infrared wavelengths emitted by a light emitter.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It will be clearly understood by those skilled in the art that various changes may be made, and equivalents may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it should be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical device, comprising:
a first circuit layer;
an optical component disposed on the first circuit layer, wherein the optical component has a light emitting area facing away from the first circuit layer and a backside surface facing the first circuit layer, and wherein the optical component comprises a first conductive pad and a second conductive pad electrically connected with the optical component and the first circuit layer;
an electronic component disposed on the first circuit layer and electrically connected with the first circuit layer;
a first conductive pillar disposed on the first conductive pad and having a first surface facing away from the first conductive pad;
a second conductive pillar disposed on the second conductive pad and having a second surface facing away from the second conductive pad;
a third conductive pillar disposed on an active surface of the electronic component facing away from the first circuit layer, wherein the third conductive pillar has a third surface facing away from the first circuit layer; and
an encapsulant disposed on the first circuit layer and covering the optical component, wherein the backside surface of the optical component is exposed from the encapsulant,
wherein the first surface of the first conductive pillar, the second surface of the second conductive pillar, and the third surface of the third conductive pillar are substantially coplanar, and
wherein the first conductive pad and the second conductive pad have different thicknesses.

2. The optical device of claim 1, wherein the first conductive pad and the second conductive pad are disposed adjacent to the light emitting area of the optical component.

3. The optical device of claim 1, further comprising a connecting element disposed adjacent to the optical component and configured to electrically connect the first conductive pad with the first circuit layer.

4. The optical device of claim 3, further comprising a second circuit layer disposed on the optical component and configured to electrically connect the first conductive pad with the connecting element.

5. The optical device of claim 4, wherein the second circuit layer comprises a region configured to allow a light of the optical component passing through.

6. The optical device of claim 4, further comprising a filter disposed on the second circuit layer.

7. The optical device of claim 1, wherein the first conductive pillar and the second conductive pillar have different thicknesses.

8. The optical device of claim 1, wherein the electronic component further comprises a third conductive pad and a fourth conductive pad, and wherein a thickness of the third conductive pad and a thickness of the fourth conductive pad are substantially equal to each other.

9. The optical device of claim 1, wherein the electronic component further comprises a backside surface opposite to the active surface of the electronic component, and wherein the backside surface of the electronic component is exposed from the encapsulant.

10. An electronic device, comprising:
a first circuit layer;
a first electronic component disposed on the first circuit layer, wherein the first electronic component has an active surface facing the first circuit layer and a backside surface facing away from the first circuit layer, and wherein the first electronic component comprises a first conductive pillar and a second conductive pillar electrically connected with the first electronic component and the first circuit layer;
a first conductive pad disposed on the active surface of the first electronic component and electrically connected with first conductive pillar and the first electronic component
a second conductive pad disposed on the active surface of the first electronic component and electrically connected with second conductive pillar and the first electronic component and
an encapsulant disposed on the first circuit layer and covering the first electronic component, wherein the backside surface of the first electronic component is exposed from the encapsulant;
wherein the first conductive pillar and the second conductive pillar have different thicknesses, and wherein the first conductive pad and the second conductive pad have different thicknesses.

11. The electronic device of claim 10, wherein the first conductive pillar has a first surface facing away from the first conductive pad and the second conductive pillar has a second surface facing away from the second conductive pad, and wherein the first surface of the first conductive pillar and the second surface of the second conductive pillar are substantially coplanar.

12. The electronic device of claim 11, further comprising a second electronic component disposed on the first circuit layer and electrically connected with the first circuit layer.

13. The electronic device of claim 12, wherein the second electronic component comprises an active surface facing the first circuit layer and a third conductive pillar disposed on the active surface of the second electronic component, wherein the third conductive pillar has a third surface facing the first circuit layer and substantially coplanar with the first surface of the first conductive pillar.

14. The electronic device of claim 13, wherein the second electronic component further comprises a third conductive pad and a fourth conductive pad, and wherein a thickness of the third conductive pad and a thickness of the fourth conductive pad are substantially equal.

15. The electronic device of claim 12, wherein the encapsulant covers the second electronic component, and wherein the second electronic component is partially exposed from the encapsulant.

16. The electronic device of claim 15, further comprising a second circuit layer disposed on the encapsulant and electrically connected with the first electronic component through the first circuit layer.

* * * * *